United States Patent [19]
Komuro

[11] Patent Number: 6,023,099
[45] Date of Patent: *Feb. 8, 2000

[54] SEMICONDUCTOR INTEGRATED CIRCUIT DEVICE WITH DUMMY PATTERN FOR EQUALIZING THICKNESS OF INTER-LEVEL INSULATING STRUCTURE

[75] Inventor: Toshio Komuro, Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/995,985

[22] Filed: Dec. 22, 1997

[30] Foreign Application Priority Data

Dec. 25, 1996 [JP] Japan ................................ 8-345092

[51] Int. Cl.⁷ .......................... H01L 27/108; H01L 29/76; H01L 31/119; H01L 29/94
[52] U.S. Cl. ......................... 257/758; 257/296; 257/306
[58] Field of Search ........................... 257/758, 773–775, 257/296–310, 211; 438/622–624, 926, 632, 243–253, 396–399

[56] References Cited

U.S. PATENT DOCUMENTS

| | | | |
|---|---|---|---|
| 5,177,584 | 1/1993 | Uchida et al. | 257/477 |
| 5,220,199 | 6/1993 | Owada et al. | 257/773 |
| 5,281,555 | 1/1994 | Cho | 438/926 |
| 5,289,422 | 2/1994 | Mam et al. | 257/296 |
| 5,300,814 | 4/1994 | Matsumoto et al. | 257/758 |
| 5,313,417 | 5/1994 | Yanagi | 438/624 |
| 5,365,091 | 11/1994 | Yamagishi | 257/758 |
| 5,414,655 | 5/1995 | Ozaki et al. | 257/306 |
| 5,441,915 | 8/1995 | Lee | 257/211 |
| 5,459,093 | 10/1995 | Kuroda et al. | 438/622 |
| 5,488,007 | 1/1996 | Kim et al. | 438/632 |

FOREIGN PATENT DOCUMENTS

| | | |
|---|---|---|
| 4-218918 | 8/1992 | Japan . |
| 5-6973 | 1/1993 | Japan . |
| 5-299599 | 11/1993 | Japan . |
| 7-153756 | 6/1995 | Japan . |
| 8-162618 | 6/1996 | Japan . |

*Primary Examiner*—Minh Loan Tran
*Assistant Examiner*—Cuong Q Nguyen
*Attorney, Agent, or Firm*—Sughrue, Mion, Zinn Macpeak & Seas, PLLC

[57] ABSTRACT

A semiconductor static random access memory device has a memory cell array assigned a central area of a major surface of a silicon substrate and a peripheral circuit assigned a peripheral area of the major surface, and the memory cell array and the peripheral circuit are covered with a multiple-layered inter-level insulating structure; and the memory cells are associated with various conductive lines extending on different inter-level insulating layers, and dummy strips are inserted on the different inter-level insulating layers so as to make the multiple-layered inter-level insulating structure constant in thickness, thereby preventing a gate electrode of a component bulk transistor of the peripheral circuit from over-etching during formation of contact holes.

13 Claims, 8 Drawing Sheets

SEMICONDUCTOR INTEGRATED CIRCUIT DEVICE WITH DUMMY PATTERN FOR EQUALIZING THICKNESS OF INTER-LEVEL INSULATING STRUCTURE

FIELD OF THE INVENTION

This invention relates to a semiconductor integrated circuit device and, more particularly, to a semiconductor integrated circuit device having a dummy pattern for equalizing a multiple-layered inter-level insulating structure.

DESCRIPTION OF THE RELATED ART

The semiconductor integrated circuit device such as, for example, a static random access memory device has a multiple-layered structure fabricated on a semiconductor substrate. The major surface of the semiconductor substrate is broken down into a central area assigned to the memory cell array and a peripheral area assigned to the peripheral circuit. A power supply line, resistors and thin film transistors are formed over the central area, and are covered with an inter-level insulating layer. The circuit components and the wiring strips over the central area cause the inter-level insulating layer to have different height from the major surface between the central area and the peripheral area. For this reason, contact holes are different in depth between the portion over the central area and the portion over the peripheral area.

FIG. 1 illustrates the structure of a typical example of the static random access memory device. The prior art static random access memory device is fabricated on a p-type silicon substrate 1, and a field oxide layer 2 is selectively grown on the major surface of the p-type silicon substrate 1. The field oxide layer 2 defines a plurality of active areas, and only two active areas 1a/1b are shown in FIG. 1. The active area 1a is assigned to a field effect transistor 3 forming a part of the peripheral circuit of the static random access memory device, and the other active area 1b is assigned to static memory cells 4.

The field effect transistor 3 includes n-type source/drain regions 3a/3b formed in the active area 1a, a gate insulating layer 3c grown on a channel region between the n-type source/drain regions 3a and 3b, a gate electrode 3d of polysilicon or polyside and side wall spacers 3e formed on side surfaces of the gate electrode 3d.

Field effect transistors 4a/4b and resistors 4c/4d form parts of the static random access memory cells 4, and an n-type common drain region 4e is shared between two of the field effect transistors 4a/4b.

The field effect transistors 3/4a/4b are covered with a first inter-level insulating layer 5, and ground lines 6a/6b of refractory metal silicide extend on the first inter-level insulating layer 5 over the field effect transistors 4a/4b. The first inter-level insulating layer 5 is overlain by a second inter-level insulating layer 7, and the resistors 4c/4d are formed on the second inter-level insulating layer 7. The resistors 4c/4d are covered with a third inter-level insulating layer 8, and a metal wiring 9 is formed on the third inter-level insulating layer 8. The first inter-level insulating layer 5, the second inter-level insulating layer 7 and the third inter-level insulating layer 8 form in combination a multiple-layered inter-level insulating structure 10.

Although only the first/second/third inter-level insulating layers 5/7/8 are laminated on the field effect transistor 3, the ground lines 6a/6b and the resistors 4c/4d are inserted between the first inter-level insulating layer 5, the second inter-level insulating layer 7 and the third inter-level insulating layer 8 over the field effect transistors 4a/4b, and, for this reason, the multiple-layered inter-level insulating structure 10 over the central area is thicker than the multiple-layered inter-level insulating structure 10 over the peripheral area. Contact holes 11a/11b are formed in the multiple-layered inter-level insulating structure 10, and the gate electrode 3d and the n-type common drain region 4e are exposed to the contact holes 11a/11b, respectively. The metal wiring 9 passes through the contact holes 11a/11b, and is held in contact with the gate electrode 3d and the n-type common drain region 4e.

The field effect transistor 3 may be replaced with a bipolar transistor 12, and FIG. 2 illustrates the structure of another prior art static random access memory device during a fabrication process. The prior art static random access memory device is fabricated on a p-type silicon substrate 20, and a field oxide layer 21 defines active areas 20a/20b in the major surface so as to assign the active areas 20a/20b to a bipolar transistor 22 and static random access memory cells 23. The static random access memory cells 23 are similar to the static random access memory cell 4, and components of the static random access memory cells 23 are labeled with the same references designating the corresponding components of the static random access memory cells 4 without detailed description.

The bipolar transistor 22 has an n-type emitter region 22a, and a phosphorous-doped polysilicon emitter electrode 22b is held in contact with the n-type emitter region 22a. The field effect transistors 4a/4b are covered with a first inter-level insulating layer 24, and the phosphorous-doped polysilicon emitter electrode 22b is patterned on the first inter-level insulating layer 24. The phosphorus-doped polysilicon emitter electrode 22b passes through a contact hole 24a formed in the first inter-level insulating layer 24 so as to be held in contact with the n-type emitter region 22a. The phosphorous-doped polysilicon emitter electrode 22b is covered with a second inter-level insulating layer 25, and the ground lines 6a/6b are patterned on the second inter-level insu-lating layer 25. The ground lines 6a/6b are covered with a third inter-level insulating layer 26, and the resistors 4c/4d are patterned on the third inter-level insulating layer 26. Tile resistors 4c/4d are covered with a fourth inter-level insulating layer 27, and the first inter-level insulating layer 24, the second inter-level insulating layer 25, the third inter-level insulating layer 26 and the fourth inter-level insulating layer 27 form in combination a multiple-layered inter-level insulating structure 28.

Contact holes 29a/29b are formed in the multiple-layered inter-level insulating structure 28, and the phosphorous-doped polysilicon emitter electrode 22b and the n-type common drain region 4e are exposed to the contact holes 29a/29b, respectively. The ground lines 6a/6b and the resistors 4c/4d cause the multiple-layered inter-level insulating structure 28 to be different in thickness between the left portion over the peripheral area and the right portion over the central area, and, accordingly, the contact hole 29b is deeper than the contact hole 29a. Metal wiring strips (not shown) are patterned on the fourth inter-level insulating layer 27, and are held in contact with the phosphorous-doped polysilicon emitter electrode 22b through the contact hole 29a and the n-type common drain region 4e through the contact hole 29b.

The multiple-layered inter-level insulating structure 10/28 is causative of the contact holes 11a/11b or 29a/29b different in depth. While etchant is forming the contact holes 11a/11b or 29a/29b different in depth, the short contact hole 11a/29a exposes the gate electrode 3d or the phosphorous-doped polysilicon emitter electrode 22b to the etchant earlier than the n-type common drain region 4e, and the etchant partially etches away the polysilicon gate electrode 3d or the phosphorous-doped polysilicon emitter electrode 22b. As a result, a recess 12/30 is formed in the gate electrode 3d or the phosphorous-doped polysilicon emitter electrode 22b. The recess 12/30 deteriorates the gate electrode 3d or the phosphorous-doped polysilicon emitter electrode 22b, and the contact between the gate electrode/emitter electrode and the metal wiring strip is less reliable. The recess 30 is serious for the bipolar transistor 22. When the etchant decreases the thickness of the phosphorous-doped polysilicon emitter electrode 22b, the recombination between the elections and holes is decreased in the polysilicon emitter electrode 22b, and, accordingly, the current amplification factor in lowered.

The polysilicon particles contaminate the prior art static random access memory device, and the manufacturer suffers from low production yield.

Moreover, the metal wiring strips are not exactly patterned through photo-lithographic techniques. In detail, photo-resist solution is spread over the upper surface of the multiple-layered inter-level insulating structure 10/28, and a wide step STP causes the photo-resist layer to vary the thickness. In this situation, when the photo-resist layer is exposed to image-carrying light, a line pattern transferred to the relatively thin portion becomes different in width from another line pattern transferred to the relatively thick portion, and, accordingly, the metal wiring strip on the relatively thin portion is differently patterned from the metal wiring strip on the relatively thick portion. For this reason, even if a metal wiring strip 31 is designed to have a constant width, the left portion 31a has a relatively small width W1, and the right portion 31b has a relatively large width W2 as shown in FIG. 3. As a result, the contact margin CM1 becomes smaller than the contact margin CM2.

In order to make the contact margin CM1 equal to the contact margin CM2, the metal wiring, the manufacturer requires a photo mask designed to have a difference in width between the left portion and the right portion. However, the design work for the photo mask becomes complicated, and the photo mask with variable line width is not practical.

If the exposure is shortened, a part of the mask pattern is not transferred to the photo resist layer. Thus, the wide step STP does not allow an aligner to exactly transfer the mask pattern to the photo resist layer, and is never desirable for the photo-lithography.

SUMMARY OF THE INVENTION

It is therefore an important object of the present invention to provide a semiconductor device which has a multiple-layered inter-level insulating structure with a constant thickness from the major surface of a semiconductor substrate and a smooth upper surface.

The present inventor contemplated the problems inherent in the prior art semiconductor devices, and noticed that a dummy pattern equalized the thickness of the multiple-layered inter-level insulating structure. The present inventor investigated the prior art semiconductor devices, and found two documents already published. The first document was Japanese Patent Publication of Unexamined Application (JPA) No. 4-218918, and the semiconductor structure disclosed therein was shown in FIG. 4. Another document was Japanese Patent Publication of Unexamined Application (JPA) No. 7-153756, and the semiconductor structure disclosed therein was shown in FIG. 5.

The prior art semiconductor structure shown in FIG. 4 had a lower-level wiring strip 41 and a dummy pad 42 formed on the major surface of a substrate 43, and the lower wiring strip 41 and the dummy pad 42 were covered with an inter-level insulating layer 44. A contact hole 45 is formed in the inter-level insulating layer 44, and an upper-level wiring strip 46 was patterned on the inter-level insulating layer 44. The upper-level wiring strip 46 passed through the contact hole 45, and was held in contact with the lower-level wiring strip 41. The dummy pad 42 was coplanar with the lower-level wiring strip 41, and improved the step coverage for the upper-level wiring strip 46. Therefore, the dummy pad 42 and the lower-level Wiring strip 41 made the inter-level insulating layer 44 different in thickness.

On the other hand, the prior art semiconductor structure shown in FIG. 5 had a dummy pattern 51 under a first-level wiring strip 52, and the first-level wiring strip 52 was covered with an inter-level insulating layer 53. A contact hole 54 was formed in the inter-level insulating layer 53, and a second-level wiring strip 55 was held in contact with the first-level wiring strip 52 through the contact hole 54. If another first-level wiring strip (not shown) extended over a bulk transistor, the dummy pattern 51 made the first-level wiring strip 52 coplanar with the other first-level wiring strip, and the contact hole 54 was equal in depth to the other first-level wiring strip. However, the dummy pattern was available for the wiring strips over the semiconductor substrate 56, only, and could not equalize the depth of the contact holes for the impurity region 4e and the electrode 3d/22b of the bulk transistor 3/22, because the dummy pattern was never inserted under the impurity region 4e.

The present inventor concluded that a dummy pattern had to be inserted on the same level as the wiring strips 6a/6b/4c/4d.

In accordance with one aspect of the present invention, there is provided a semiconductor integrated circuit device fabricated on a substrate and comprising a plurality of conductive lines formed over a major surface of the substrate and forming parts of an integrated circuit, a multiple-layered inter-level insulating structure formed on the major surface so as to cover the plurality of conductive lines and having at least one inter-level insulating layer spaced from the major surface rather than the plurality of conductive lines and a plurality of contact holes to which upper surfaces of the plurality of conductive lines are exposed, a wiring pattern formed on the at least one inter-level insulating layer so as to provide conductive paths in the integrated circuit and located over a certain conductive line selected from the plurality of conductive lines, a dummy pattern formed on the at least one inter-level insulating layer, located over another conductive line selected from the plurality of conductive lines and isolated from functions of the integrated circuit, and a conductive means formed on the multiple-layered inter-level insulating structure so as to provide conductive paths in the integrated circuit and held in contact with the plurality of conductive lines through the plurality of contact holes.

BRIEF DESCRIPTION OF THE DRAWINGS

The features and advantages of the semiconductor device will be more clearly understood from the following description taken in conjunction with the accompanying drawings in which.

DESCRIPTION OF THE PREFERRED EMBODIMENTS

First Embodiment

Figure 6:
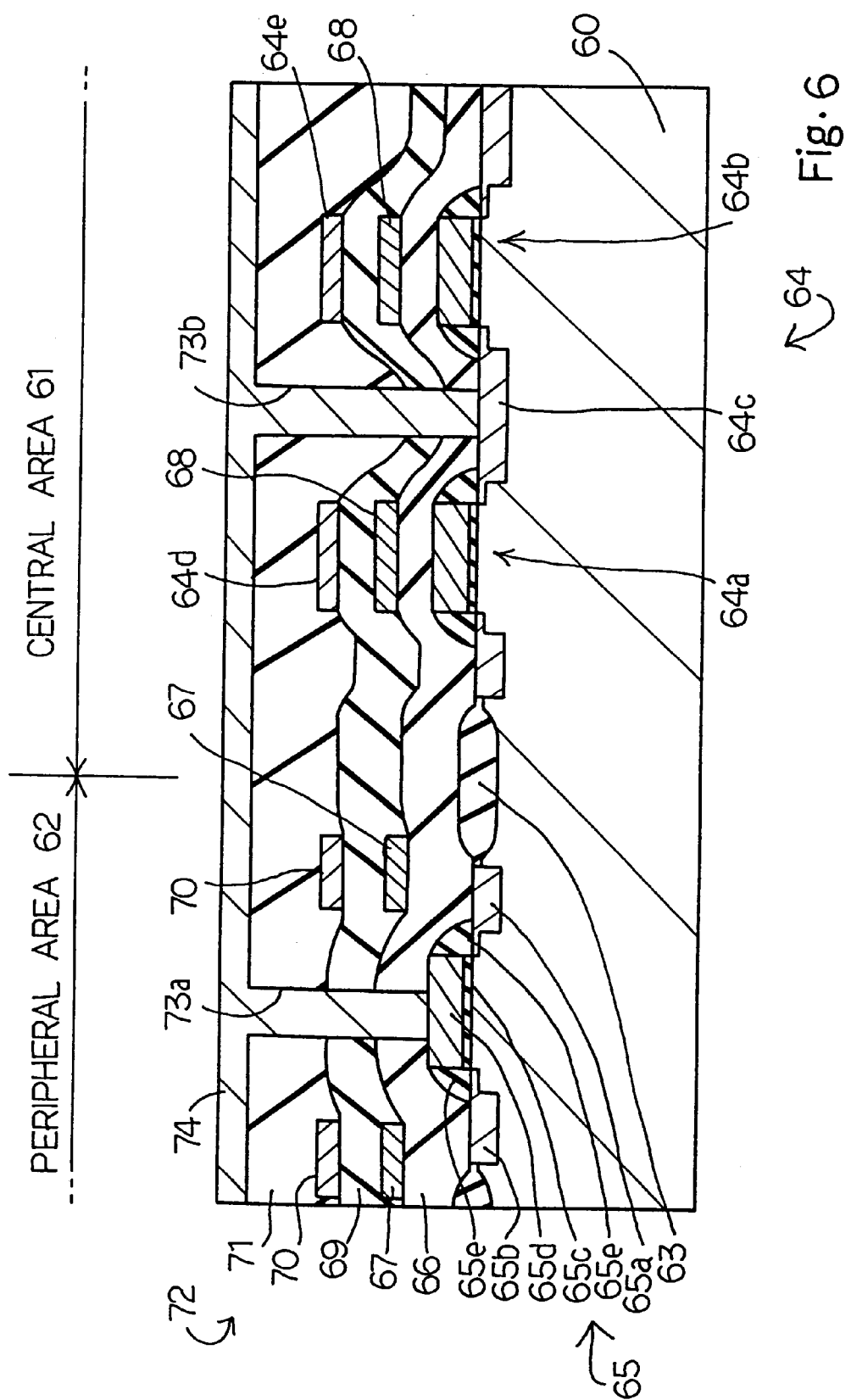
FIG. 6 is a cross sectional view showing the structure of a semiconductor integrated circuit device according to the present invention.

Referring to FIG. 6 of the drawings, a semiconductor static random access memory device embodying the present invention is fabricated on a p-type silicon substrate 60. The p-type silicon substrate 60 is divided into a central area 61 assigned to a static memory cell array and a peripheral area 62 assigned to a peripheral circuit. The static memory cell array and the peripheral circuit form in combination an integrated circuit.

A field oxide layer 63 is selectively grown on a major surface of the p-type silicon substrate 60, and defines active areas in the central/peripheral areas 61/62. FIG. 6 shows two active areas one of which is assigned to field effect transistors 64a/64b of static random access memory cells 64 and the other of which is assigned to a field effect transistor 65. The static random access memory cells 64 form parts of the static memory cell array, and the field effect transistor 65 is a component transistor of the peripheral circuit.

The field effect transistor 65 includes n-type source/drain regions 65a/65b, a gate insulating layer 65c covering a channel region between the n-type source/drain regions 65a and 65b, a polysilicon gate electrode 65d formed on the gate insulating layer 65c and side wall spacers 65e formed on the side surfaces of the polysilicon gate electrode 65d.

An n-type source/drain region 64c is shared between the field effect transistors 64a and 64b, and the static random access memory cells 64 further includes resistors 64d/64e.

The field effect transistors 65/64a/64b are covered with a first inter-level insulating layer 66, and dummy strips 67 and ground lines 68 extend on the first inter-level insulating layer 66. The dummy strips 67 are located over the peripheral area 62, and the ground lines 68 are located over the central area 61. The dummy strips 67 and the ground lines 68 are equal in thickness, and the dummy strips 67 and the ground lines 68 are formed of tungsten silicide. The ground lines 68 supply the ground potential to components of the integrated circuit. However, the dummy strips 67 do not participate in the function of the integrated circuit.

The dummy strips 67 and the ground lines 68 are covered with a second inter-level insulating layer 69, and dummy strips 70 and the resistors 64d/64e extend on the second inter-level insulating layer 69. The dummy strips 70 are located over the peripheral area 62, and the resistors 64d/64e are located over the central area 61. The dummy strips 70 are equal in thickness to the resistors 64d/64e, and the dummy strips 70 and the resistors 64d/64e are formed of polysilicon. The dummy strips 70 do not participate in the function of the integrated circuit. The dummy strips 70 and the resistors 64d/64e are covered with a third inter-level insulating layer 71, and the first inter-level insulating layer 66, the second inter-level insulating layer 69 and the third inter-level insulating layer 71 as a whole constitute a multiple-layered inter-level insulating structure 72.

Contact holes 73a/73b are formed in the multiple-layered inter-level insulating structure 72, and the polysilicon gate electrode 65d and the n-type source/drain region 64c are exposed to the contact holes 73a/73b, respectively. The dummy strips 67 and 70 are spaced from the contact hole 73a by 0.4 microns to 1 micron, and a bit line 74 of aluminum is formed on the multiple-layered inter-level insulating structure 72. The bit line 74 passes through the contact holes 73a/73b, and is held in contact with the polysilicon gate electrode 65d and the n-type source/drain region 64c.

The dummy strips 67 and 70 lifts the upper surface of the multiple-layered inter-level insulating structure 72 so as to equalize the thickness between the central area 61 and the peripheral area 62. Thus, the dummy strips 67/70 make the upper surface of the multiple-layered inter-level insulating structure 72 smooth. When an aluminum layer is patterned into the bit line 74, the mask pattern is exactly transferred to a photo resist layer, and the bit line 74 is constant in width.

Moreover, the contact hole 73a is different in depth from the contact hole 73b by the total thickness of the polysilicon gate electrode 65d and the gate insulating layer 65c, and the etchant scarcely etches the polysilicon gate electrode 65d. As a result, the connection between the polysilicon gate electrode 65d and the bit line 74 is reliable, and the field effect transistor 65 is never deteriorated.

The semiconductor static random access memory device is fabricated as follows. Firstly, the thick field oxide layer 63 is selectively grown to 3500 angstroms thick on the major surface of the p-type silicon substrate 60 by using the LOCOS (local oxidation of silicon) technique, and the gate insulating layers are thermally grown to 100 angstroms thick on the active areas assigned to the field effect transistors 65/64a/64b.

Polysilicon is deposited to 2000 angstroms to 4000 angstroms thick over the entire surface of the resultant semiconductor structure by using a chemical vapor deposition, and the polysilicon layer is coated with a glass layer produced from $POCl_3$. The glass layer is heated, and the polysilicon layer is decreased in resistivity.

Photo resist solution is spun onto the resultant semiconductor structure, and is baked so as to cover the polysilicon layer with a photo resist layer. A pattern image is transferred from a photo mask (not shown) to the photo resist layer, and a latent image is formed in the photo resist layer. The latent image is developed, and the photo resist layer is patterned into a photo resist etching mask. Using the photo resist etching mask, the polysilicon layer is selectively etched away. Thus, the polysilicon layer is patterned into the gate electrodes of the field effect transistors 65/64a/64b by using photo-lithographic techniques and the etching.

Phosphorous is ion implanted into the active areas at dose of $1 \times 10^{13}$ $cm^{-2}$, and lightly-doped n-type source/drain re-ions of the field effect transistors 65/64a/64b are formed in the active areas in a self-aligned manner with the gate electrodes. Silicon oxide is deposited over the entire surface of the resultant semiconductor structure, and the silicon oxide layer is anisotropically etched so as to form the side wall spacers of the field effect transistors 65/64a/64b. Arsenic is ion implanted into the active areas at dose of $1 \times 10^{15}$ cm$^2$, and heavily-doped n-type source/drain regions of the field effect transistors 65/64a/64b are formed in a self-aligned manner with the side wall spacers. Thus, the n-type source/drain regions of the field effect transistors 65/64a/64b have the LDD (Lightly Doped Drain) structure.

Subsequently, silicon oxide is deposited to 1000 angstroms thick over the entire surface of the resultant semiconductor structure by using the chemical vapor deposition so as to cover the field effect transistors 65/64a/64b with the first inter-level insulating layer 66.

Tungsten silicide (WSi) is deposited to 1000 angstroms thick over the entire surface of the resultant semiconductor structure by using a sputtering, and the tungsten silicide layer is patterned into the dummy strips 67 and the ground lines 68 by using the photo-lithographic techniques and the etching. The dummy strips 67 are only spaced from the contact hole 73a by 0.4 micron to 1 micron.

Silicon oxide is deposited to 1000 angstroms thick over the entire surface of the resultant semiconductor structure by using the chemical vapor deposition, and forms the second inter-level insulating layer 69. Polysilicon is deposited to 800 angstroms thick over the silicon oxide layer by using the chemical vapor deposition, and the second inter-level insulating layer 69 is overlain by a polysilicon layer. The polysilicon layer is patterned into the resistors 64d/64e and the dummy strips 70 by using the photo-lithographic techniques and the etching. The dummy strips 70 are spaced from the contact hole 73a by 0.4 micron to 1 micron.

Boro-phosphosilicate glass is deposited to 3000 angstroms to 5000 angstroms thick over the entire surface of the resultant semiconductor structure by using a chemical vapor deposition, and the boro-phosphosilicate glass layer is reflowed so as to improve the step coverage. The boro-phosphosilicate glass layer serves as the third inter-level insulating layer 71.

A photo resist etching mask (not shown) is provided on the third inter-level insulating layer 71 for the contact holes 73a/73b by using the photo-lithographic techniques, and the multi-layered inter-level insulating structure 72 is selectively etched away by using a reactive ion-etching for forming the contact holes 73a/73b. The contact holes 73a/73b have a square cross section of 0.5 micron by 0.5 micron.

Aluminum is deposited over the entire surface of the resultant semiconductor structure by using a sputtering. The aluminum fills the contact holes 73a/7b, and swells into an aluminum layer of 3000 angstroms thick. The aluminum layer is patterned into the bit line 74 by using the photo lithographic techniques and the etching, and the contact holes 73a/73b are exactly located under the bit line 74, because the bit line 74 is constant in width.

In this instance, the polysilicon gate electrode 65d and the n-type source/drain region 64c serve as the plurality of conductive lines, and the ground lines 68 and the resistors 64d/64e as a whole constitute a wiring pattern. The dummy strips 67170 form the dummy pattern, and the bit line 74 serves as the conductive means.

As will be appreciated from the foregoing description, the dummy strips 67/70 make the multiple-layered inter-level insulating structure 72 substantially constant in thickness, and improve the smoothness of the multiple-layered inter-level insulating structure 72. The dummy strips 67/70 are available for the n-type impurity region 64c and the polysilicon gate electrode 65d under the multiple-layered inter-level insulating structure 72.

Second Embodiment

Figure 7:
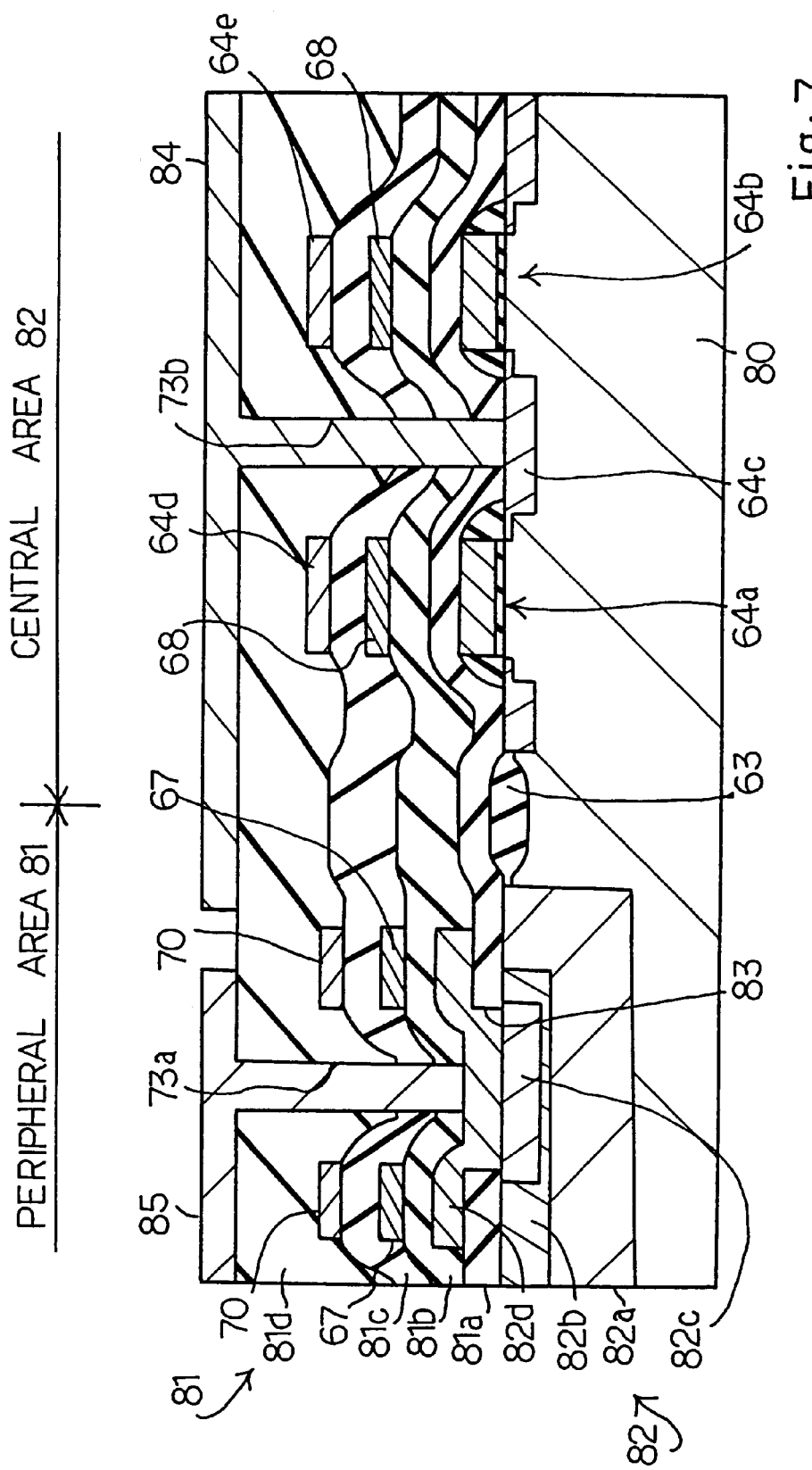
FIG. 7 is a cross sectional view showing the structure of another semiconductor integrated circuit device according to the present invention.
Figure 8:
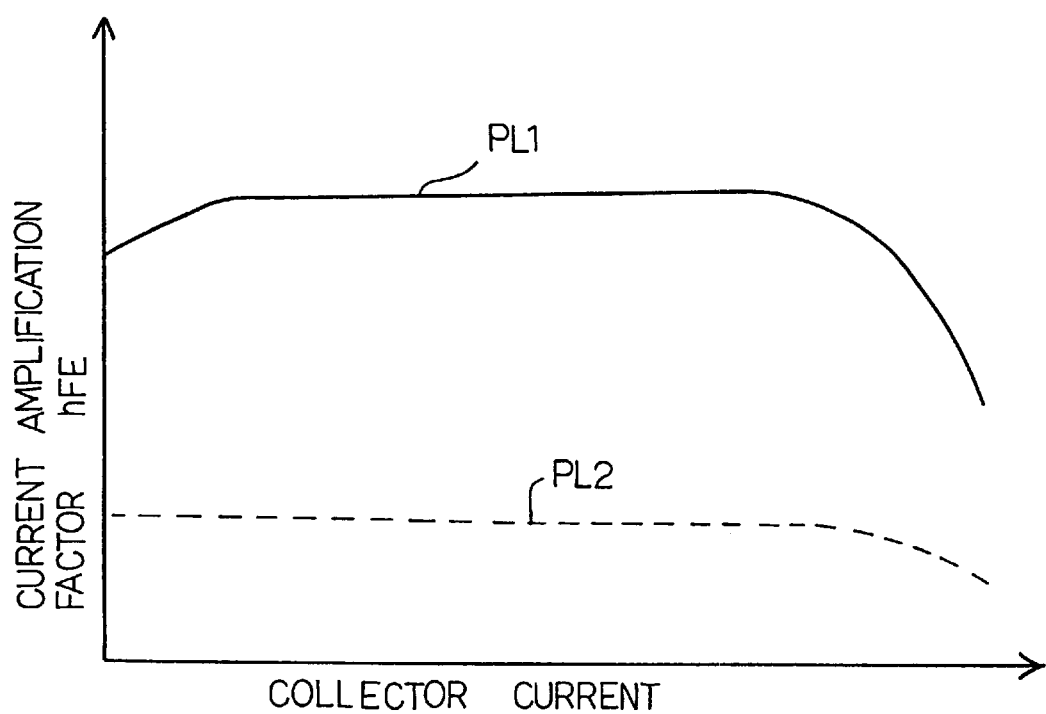
FIG. 8 is a graph showing the current amplification factor in terms of the corrector current measured for the prior art bipolar transistor and a bipolar transistor incorporated in the semiconductor integrated circuit device shown in FIG. 7.

Turning to FIG. 7 of the drawings, another semiconductor integrated circuit device embodying the present invention is fabricated on a p-type silicon substrate 80. The major surface of the p-type silicon substrate 80 is divided into a central area 81 assigned to memory cell array and a peripheral area 82 assigned to a peripheral circuit, and the memory cell array and the peripheral circuit form in combination an integrated circuit.

The semiconductor integrated circuit device implementing the second embodiment is similar to the first embodiment except for a multiple-layered inter-level insulating structure 31 and an n-p-n type bipolar transistor 82 forming a part of the peripheral circuit. For this reason, the other layers and regions are labeled with the same references designating corresponding layers/regions of the first embodiment without detailed description.

The n-p-n type bipolar transistor 81 has an n-type collector region 82a, a p-type base region 82b and an n-type emitter region 82c, and an n-type polysilicon emitter electrode 82d is led in contact with the n-type emitter region 82c.

A first inter-level insulating layer 81a, a second inter-level insulating layer 81b, a third inter-level insulating layer 81c and a fourth inter-level insulating layer 81d constitute the multiple-layered inter-level insulating structure 81. The field effect transistors 64a/64b are covered with the first inter-level insulating layer 81a, and an emitter contact hole 83 is formed in the first inter-level insulating layer 81a. The n-type polysilicon emitter electrode 52d is held in contact with the n-type emitter region 52c through the emitter contact hole 83, and the n-type polysilicon emitter electrode 82d is covered with the second inter-level insulating layer 81b.

The dummy strips 67 and the ground lines 68 extend on the second inter-level insulating layer 81b, and are covered with the third inter-level insulating layer 81c. The dummy strips 70 and the resistors 64d/64e extend on the third inter-level insulating layer 81c, and are covered with the fourth inter-level insulating layer 81d.

The contact holes 73a/73b are formed in the multiple-layered inter-level insulating structure 81, and a bit line 84 of aluminum and a conductive line 85 are held in contact with the n-type source/drain region 64c and the n-type polysilicon emitter electrode 82d through the contact holes 73a/73b, respectively.

The semiconductor static random access memory device is fabricated as follows. First, the field effect transistors 64a/64b and the collector/base regions 82a/82b of the n-p-n type bipolar transistor 82 are fabricated on the p-type silicon substrate 80, and silicon oxide is deposited to 1000 angstroms thick over the entire surface of the resultant semiconductor structure by using the chemical vapor deposition. The silicon oxide forms the first inter-level insulating layer 81a.

The emitter contact hole 83 is formed in the first inter-level insulating layer 83 by using the photo-lithographic techniques and the etching, and polysilicon is deposited to 1500 angstroms thick over the first inter-level insulating layer 83 by using the chemical vapor deposition. Phosphorous is diffused into the polysilicon layer, and the phosphorous-doped polysilicon layer is patterned into the n-type polysilicon emitter electrode 82d by using the photo-lithographic techniques and the etching. The phosphorous is diffused from the n-type polysilicon emitter electrode 82d into the base region 82b, and forms the n-type emitter region 82c.

Thereafter, the second inter-level insulating layer 81b, the third inter-level insulating layer 81c and the fourth inter-level insulating layer 81d are laminated on the first inter-level insulating layer 81a. The dummy strips 67 and the ground lines 68 are patterned on the second inter-level insulating layer 81b, and the dummy strips 70 and the resistors 64d/64e are patterned on the third inter-level insulating layer 81c in a similar manner to the first embodiment. The dummy strips 67 and 70 are located over the n-p-n type bipolar transistor 82, and make the multiple-layered inter-level insulating structure 81 constant in thickness over the n-p-n type bipolar transistor 82 and the field effect transistors 64a/64b.

The contact holes 73a/73b are formed in the multiple-layered inter-level insulating structure 81 by using the photo-lithographic techniques and the etching. Aluminum is deposited over the entire surface of the resultant semiconductor structure by using the sputtering, and the aluminum layer is patterned into the bit line 84 and the conductive line 85 by using the lithographic techniques and the etching The dummy strips 67/70 achieve all the advantages of the first embodiment. Especially, the n-type polysilicon emitter electrode 82d is scarcely etched during the etching step for the contact holes 73a/73b, and the n-p-n type bipolar transistor 82 achieves a large current amplification factor hFE.

Figure 1:
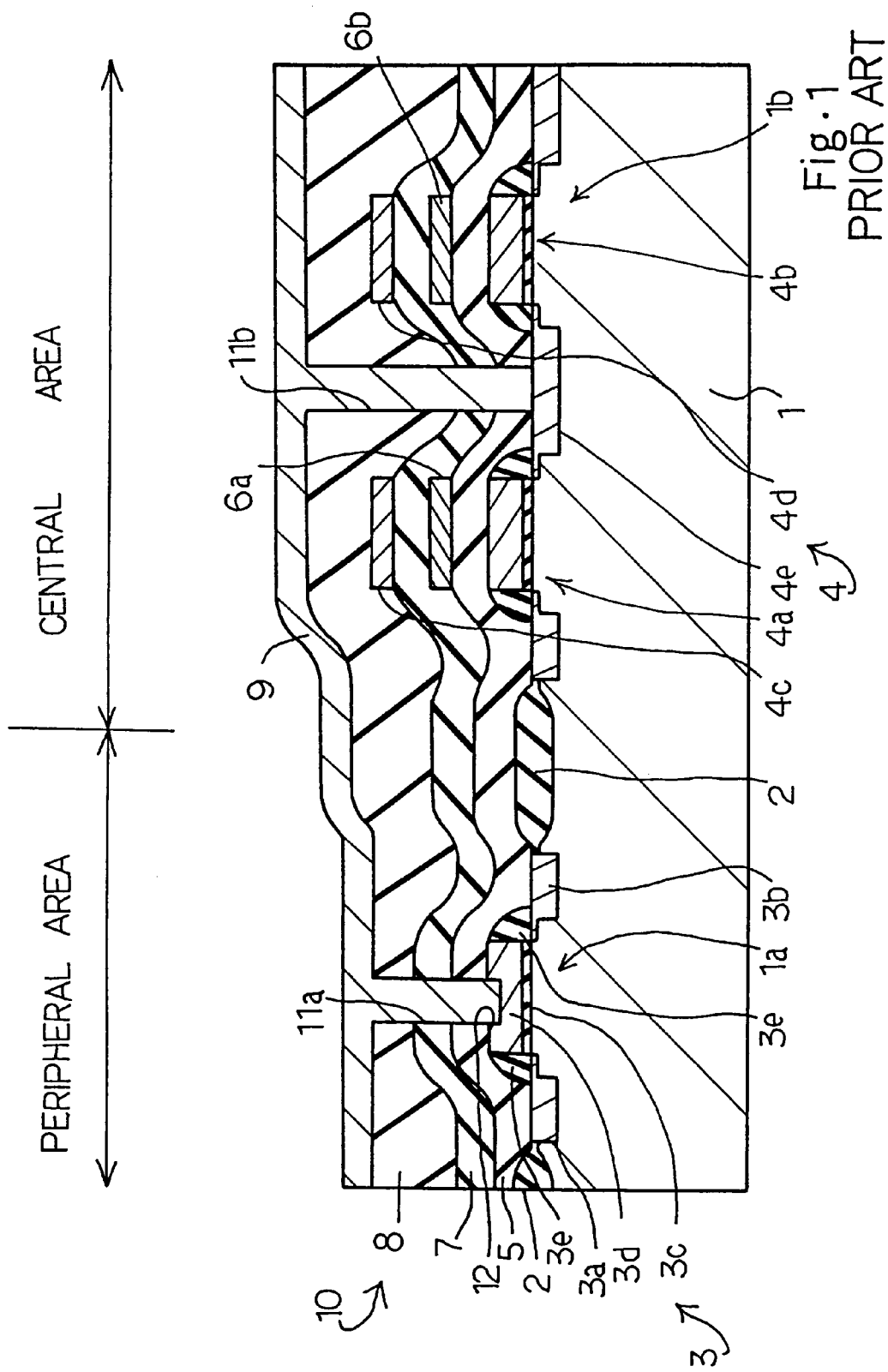
FIG. 1 is a cross sectional view showing the structure of the prior art static random access memory device.
Figure 2:
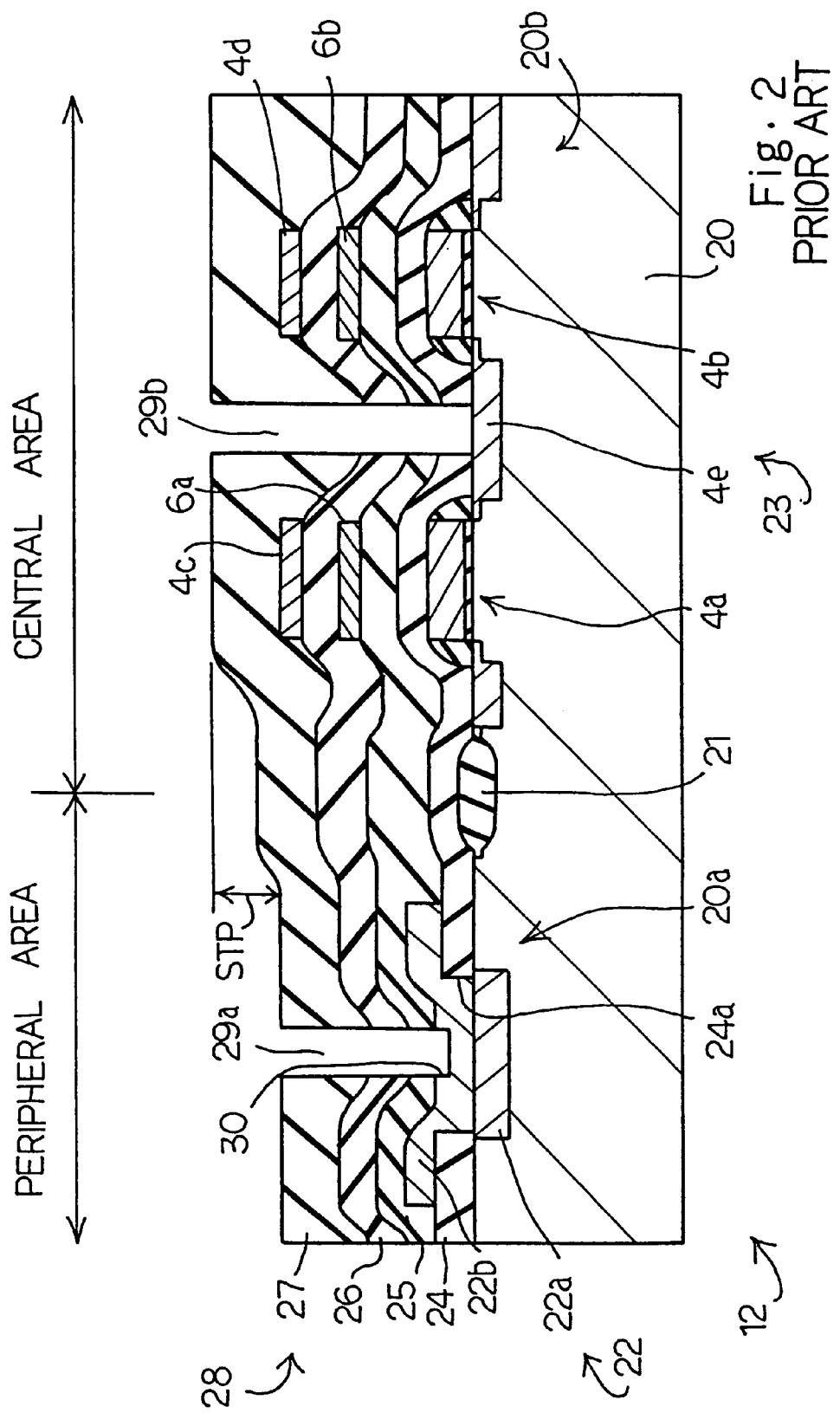
FIG. 2 is a cross sectional view showing the structure of another prior art static random access memory device.
Figure 3:
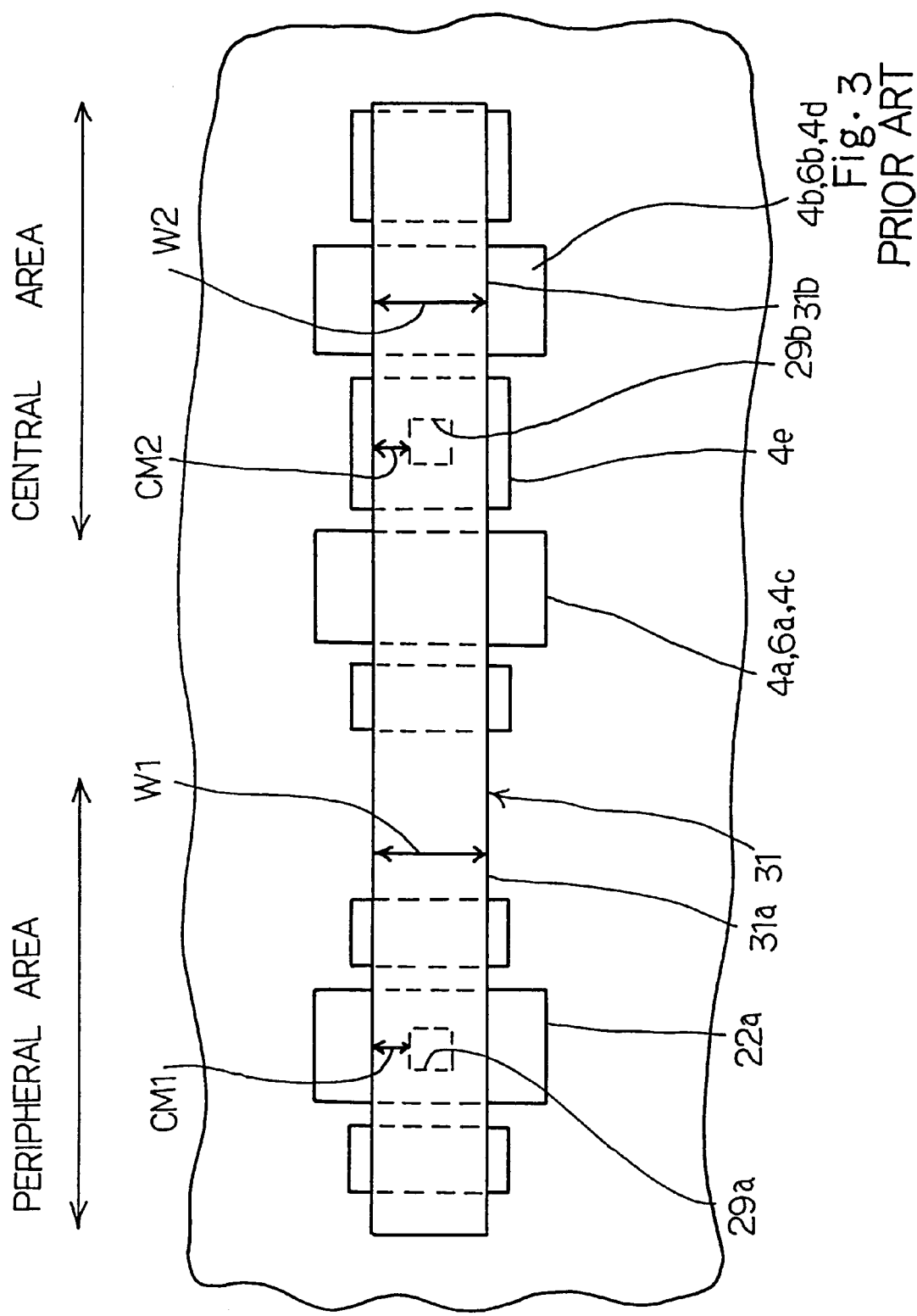
FIG. 3 is a plane view showing the metal wiring strip extending over the multiple-layered inter-level insulating structure incorporated in the prior art static random access memory device.
Figure 4:
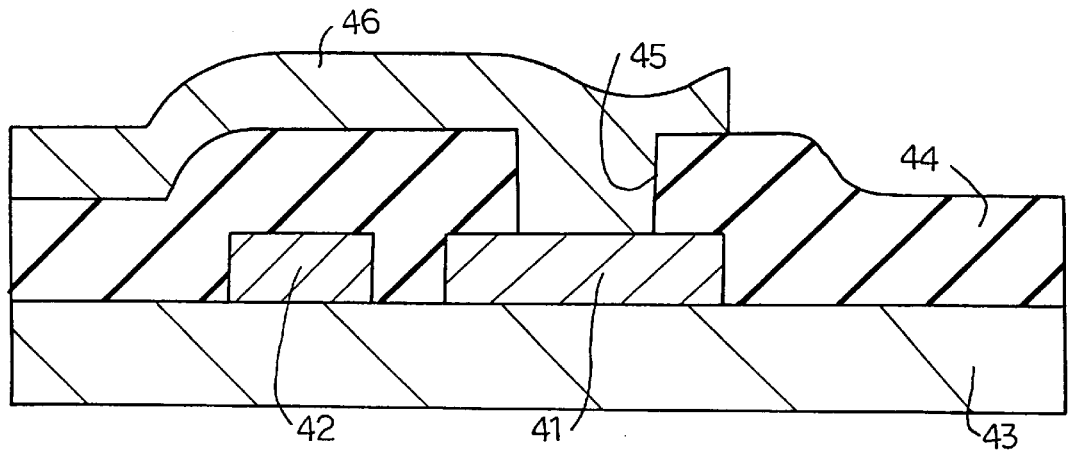
FIG. 4 is a cross sectional view showing the structure of the prior art semiconductor device disclosed in Japanese Patent Publication of Unexamined Application No. 4-218918.
Figure 5:
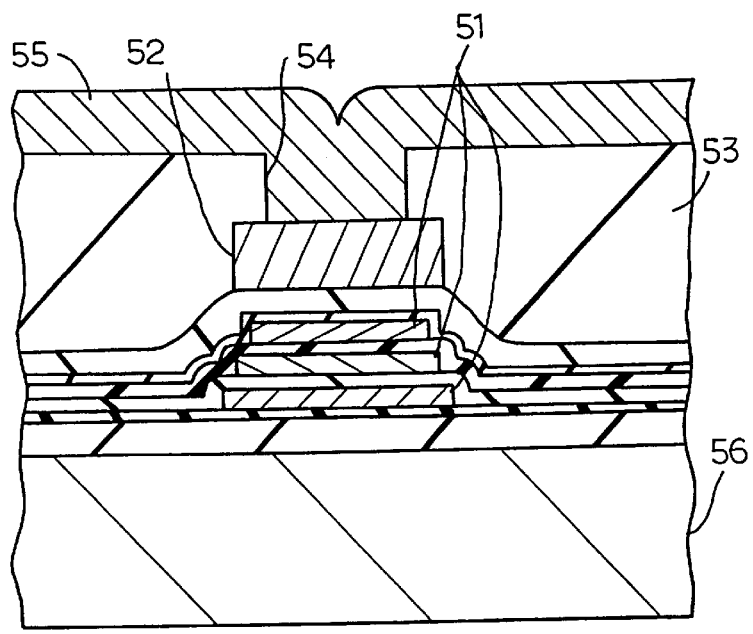
FIG. 5 is a cross sectional view showing the structure of the prior art semiconductor device disclosed in Japanese Patent Publication of Unexamined Application No. 7-153756.

The present inventor evaluated the semiconductor static random access memory device shown in FIG. 7. The present inventor measured the collector current, and calculated the current amplification factor. The current amplification factor was plotted as indicated by plots PL1 for the semiconductor static random access memory device of the present invention and plots PL2 for the prior art semiconductor static random access memory device shown in FIG. 2. Comparing plots PL1 with plots PL2, it was understood that the etchant hardly damaged the n-type polysilicon emitter electrode 82d.

Although particular embodiments of the present invention haste been shown and described, it will be obvious to those skilled in the art that various changes and modifications may be made without departing from the spirit and scope of the present invention.

For example, the dummy strings may be used in any kind of semiconductor device such as, for example, a semiconductor dynamic random access memory device.

Figure 9:
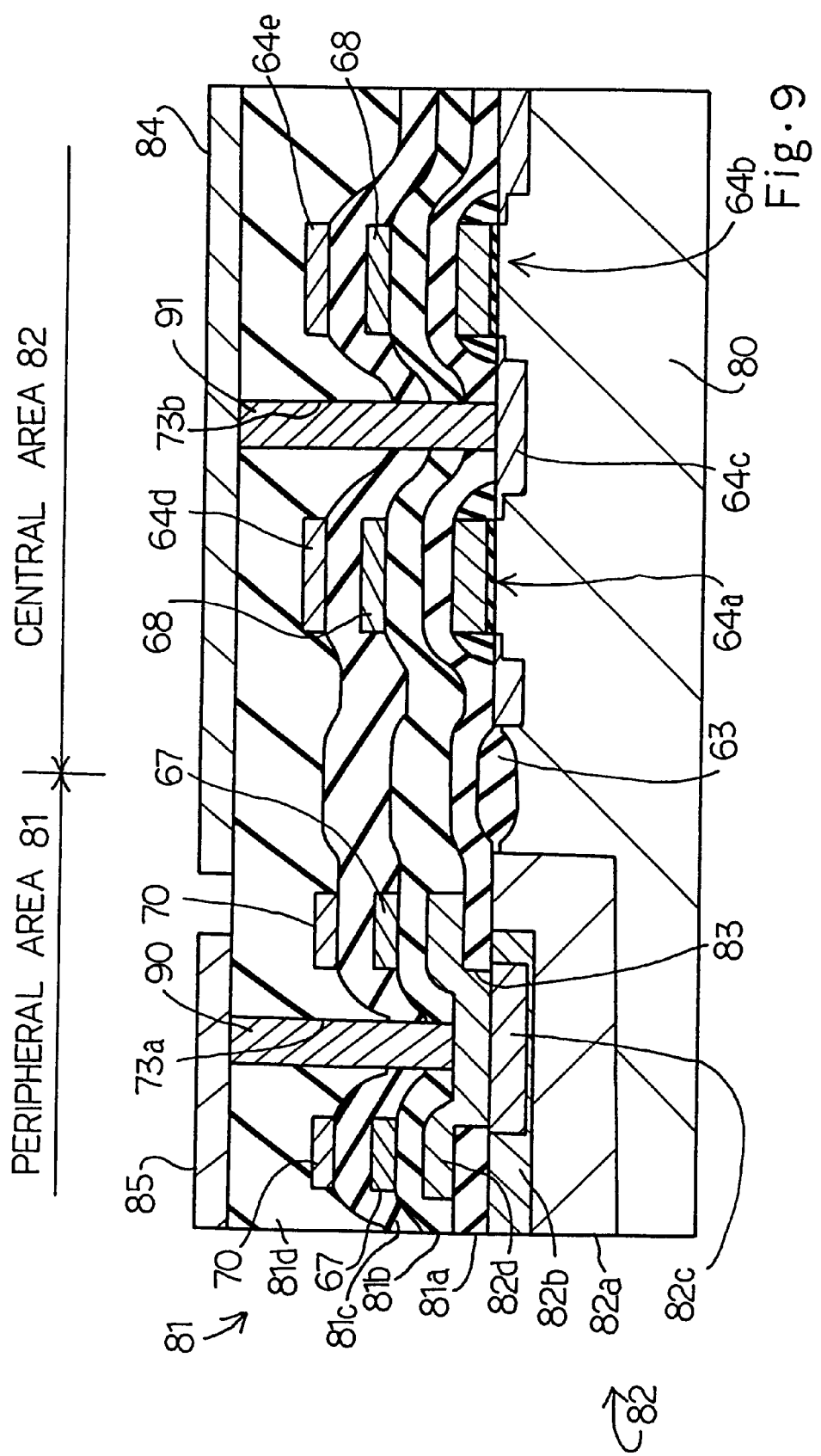
FIG. 9 is a cross sectional view showing the structure of yet another semiconductor integrated circuit device according to the present invention.

Conductive plugs 90/91 (FIG. 9) may be inserted into the contact hole so as to connect the bit line to the electrode/impurity region.

The dummy strips may be formed over a conductive wiring formed on an inter-level insulating layer.

An insulating substrate or a semi-insulating substrate may be used for a semiconductor integrated circuit device according to the present invention.

In the embodiment described hereinbefore, the dummy strips are provided on different two inter-level insulating layers. However, a dummy patter may be formed on an inter-level insulating layer or on more than two inter-level insulating layers.

What is claimed is:

1. A semiconductor integrated circuit device fabricated on a substrate having a major surface containing a central area assigned to memory cells forming a part of an integrated circuit and a peripheral area assigned to a peripheral circuit forming another part of said integrated circuit, comprising:

a plurality of conductive lines respectively disposed over said central area and over said peripheral area;

a multiple-layered inter-level insulating structure formed on said major surface so as to cover said plurality of conductive lines, and having at least one inter-level insulating layer spaced from said major surface and a plurality of contact holes to which upper surfaces of said plurality of conductive lines are exposed, wherein said at least one inter-level insulating layer includes a first layer;

a wiring pattern formed on said at least one inter-level insulating layer so as to provide conductive paths in said integrated circuit, and located over a certain conductive line selected from said plurality of conductive lines and located over said central area;

a dummy pattern formed of a conductive material identical with that for said wiring pattern on said at least one inter-level insulating layer, located over another conductive line selected from said plurality of conductive lines and located over said peripheral area, and isolated from functioning elements of said integrated circuit; and a conductive means formed on said multiple-layered inter-level insulating structure so as to provide conductive paths in said integrated circuit, and held in contact with said plurality of conductive lines through said plurality of contact holes;

wherein said dummy pattern is formed so that said conductive means is approximately the same distance from the substrate over the central area as over the peripheral area.

2. The semiconductor integrated circuit device as set forth in claim 1, in which said wiring pattern and said dummy pattern are formed of similar material.

3. The semiconductor integrated circuit device as set forth in claim 1, in which said certain conductive line is an impurity region formed in said substrate, and said another conductive line is a gate electrode of a bulk field effect transistor.

4. The semiconductor integrated circuit device as set forth in claim 3, in which said impurity region forms a part of a memory cell assigned a first area of said major surface of said substrate, and said bulk field effect transistor forms a part of a peripheral circuit assigned a second area of said major surface of said substrate.

5. The semiconductor integrated circuit device as set forth in claim 4, in which said wiring pattern includes power supply lines formed on said first inter-level insulating layer and resistors formed on a second inter-level insulating layer of said multiple-layered insulating structure spaced further from said major surface than is said first inter-level insulating layer and said dummy pattern includes first dummy strips formed on said first inter-level insulating layer and second dummy strips formed on said second inter-level insulating layer.

6. The semiconductor integrated circuit device as set forth in claim 5, in which said power supply lines and said resistors extend in the vicinity of one of said plurality of contact holes open to said impurity region, and said first dummy strips and said second dummy strips extend in the vicinity of another of said plurality of contact holes open to said gate electrode.

7. The semiconductor integrated circuit device as set forth in claim 6, in which the distance between said power supply lines and said one of said plurality of contact holes, the distance between said resistors and said one of said plurality of contact holes, the distance between said first dummy strips and said another of said plurality of contact holes and the distance between said second dummy strips and said another of said plurality of contact holes range from 0.4 micron to 1 micron.

8. The semiconductor integrated circuit device as set forth in claim 1, in which said certain conductive line is an impurity region formed in said substrate, and said another conductive line is an emitter electrode of a bulk bipolar transistor.

9. The semiconductor integrated circuit device as set forth in claim 8, in which said impurity region forms a part of a memory cell assigned a first area of said major surface of said substrate, and said bulk bipolar transistor forms a part of a peripheral circuit assigned a second area of said major surface of said substrate.

10. The semiconductor integrated circuit device as set forth in claim 9, in which said wiring pattern includes power supply lines formed on said first inter-level insulating layer of said multiple-layered inter-level insulating structure, and said dummy pattern includes first dummy strips formed on said first inter-level insulating layer and second dummy strips formed on a second inter-level insulating layer of said multiple layered insulating structure spaced further from said major surface than is said first inter-level insulating layer.

11. The semiconductor integrated circuit device as set forth in claim 10, in which said power supply lines and said resistors extend in the vicinity of one of said plurality of contact holes open to said impurity region, and said first dummy strips and said second dummy strips extend in the vicinity of another of said plurality of contact holes open to said emitter electrode.

12. The semiconductor integrated circuit device as set forth in claim 1, in which conductive plugs are provided in said plurality of contact holes so as to connect said conductive means to said plurality of conductive lines.

13. A semiconductor integrated circuit device fabricated on a semiconductor substrate having a major surface divided into a central area and a peripheral area, comprising:

a multiple-layered inter-level insulating structure formed on said major surface, and including at least a first inter-level insulating layer over said major surface, a second inter-level insulating layer laminated over said first inter-level insulating layer, a first contact hole and a second contact hole;

at least one memory cell formed in said central area, and including at least one bulk field effect transistor covered with said multiple-layered inter-level insulating structure and having a first impurity region formed in said central area and exposed to said first contact hole and a gate structure formed on said central area and at least one resistive line formed on said second inter-level insulating layer over said central area;

a power potential line formed on said first inter-level insulating layer over said central area;

a peripheral circuit forming an integrated circuit together with said at least one memory cell, formed in said peripheral area under said first inter-level insulating layer, and including a bulk transistor having a second impurity region formed in said peripheral area and an electrode formed between said peripheral area and said first inter-level insulating layer and exposed to said second contact hole; and a spacing means including first dummy strips formed of a first material identical with that of said power potential line and extending on said first inter-level insulating layer over said peripheral area and second dummy strips formed of a second material identical with that of said at least one resistive line and extending on said second inter-level insulating layer over said peripheral area, wherein said first dummy strips and said second dummy strips are formed so that a surface of said multi-layered inter-level insulating structure is approximately the same distance from said semiconductor substrate over said central area as over said peripheral area.

* * * * *

UNITED STATES PATENT AND TRADEMARK OFFICE
CERTIFICATE OF CORRECTION

PATENT NO.   : 6,023,099
DATED        : February 8, 2000
INVENTOR(S)  : Toshio Komuro It is certified that error appears in the above-identified patent and that said Letters Patent is hereby corrected as shown below:

Column 2,
Line 43, delete "Tile" and insert --The--,

Column 7,
Line 8, delete "$1 \times 10^{15} cm^2$ and insert therefor --$1 \times 10^{15} cm^{-2}$--,
Line 52, delete "73a/7b" and insert therefor --73a/73b--,
Line 61, delete "67170" and insert therfor --67/70--.

Column 8,
Line 17, delete "31" and insert therefor --81--,
Line 33, delete "52d" and insert therefor --82d--,
Line 34, delete "52c" and insert therefor --82c--.

Signed and Sealed this

Seventeenth Day of July, 2001

*Attest:*

NICHOLAS P. GODICI
*Attesting Officer*     *Acting Director of the United States Patent and Trademark Office*